(12) United States Patent
Feudel et al.

(10) Patent No.: US 6,410,410 B1
(45) Date of Patent: Jun. 25, 2002

(54) METHOD OF FORMING LIGHTLY DOPED REGIONS IN A SEMICONDUCTOR DEVICE

(75) Inventors: Thomas Feudel, Radebeul; Manfred Horstmann, Dresden; Karsten Wieczorek, Boxdorf, all of (DE)

(73) Assignee: Advanced Micro Devices, Inc., Austin, TX (US)

( * ) Notice: Subject to any disclaimer, the term of this patent is extended or adjusted under 35 U.S.C. 154(b) by 0 days.

(21) Appl. No.: 09/852,535

(22) Filed: May 10, 2001

(30) Foreign Application Priority Data

Nov. 23, 2000 (DE) .......................... 100 58 031

(51) Int. Cl.⁷ .......................................... H01L 21/225
(52) U.S. Cl. ...................... 438/547; 438/549; 438/563
(58) Field of Search ............................ 438/545, 547, 438/548, 549, 558, 563

(56) References Cited

U.S. PATENT DOCUMENTS

| | | | |
|---|---|---|---|
| 4,433,008 A | * 2/1984 | Scnable et al. | 438/563 |
| 4,597,824 A | * 7/1986 | Shinada et al. | 438/547 |
| 5,591,667 A | * 1/1997 | Byun et al. | 438/563 |
| 5,650,347 A | * 7/1997 | Choi | 438/547 |

* cited by examiner

Primary Examiner—Chandra Chaudhari
(74) Attorney, Agent, or Firm—Williams, Morgan & Amerson, P.C.

(57) ABSTRACT

A method is disclosed in which a lightly doped region in a semiconductor layer is obtained by diffusing dopant atoms of a first and second type into the underlying semiconductor layer. Preferably, the method is applied to the formation of lightly doped source and drain regions in a field effect transistor so as to obtain a required gradual dopant concentration transition from the general region to the drain and source regions for avoiding the hot carrier effect. Advantageously, a diffusion of the dopant atoms is initiated during an oxidizing step in which the thickness of the gate insulation layer is increased at the edge portions thereof.

11 Claims, 2 Drawing Sheets

METHOD OF FORMING LIGHTLY DOPED REGIONS IN A SEMICONDUCTOR DEVICE

BACKGROUND OF THE INVENTION

1. Field of the Invention

The present invention relates to the field of semiconductor manufacturing, and, in particular, to the formation of lightly doped regions in a semiconductor device.

2. Description of the Related Art

The manufacturing process of integrated circuits involves the fabrication of numerous semiconductor elements on a single substrate, such as a silicon wafer. Modern integrated circuits consisting of billions of semiconductor elements, such as insulated gate field effect transistors, require a large number of complex and complicated process steps to finally complete these semiconductor elements and to electrically connect them for forming a circuitry having the desired functionality. Since critical dimensions of device features, such as the gate length of field effect transistors, are steadily decreasing to enhance integration density and improve device performance, for instance with respect to signal processing time and power consumption, each of these process steps needs to be performed with a correspondingly increasing degree of precision in order to meet the design requirements of these device features. On the other hand, for economical reasons, each process step should be carried out time-effectively to insure a high throughput and enhance productivity, thereby using the manufacturing equipment as efficiently as possible. One important process step in forming, for example, insulated gate field effect transistors that is gaining in importance when feature sizes such as the gate length of the transistor and the thickness of the gate insulation layer are reduced is the formation of lightly doped regions in a semiconductor layer. In modern field effect transistors, the thickness of the gate insulation layer separating the gate electrode from the underlying transistor active region is reduced to only a few nanometers. Moreover, the gate length of the transistor, and therefore the channel length, is steadily being scaled down, while the voltages applied to the gate, source and drain terminals of the transistor device are merely reduced to a small degree, so that the lateral electric field prevailing in the channel region of the device is increased. Consequently, charge carriers in the channel may gather sufficient energy to overcome the potential barrier between the channel and the gate insulation layer, and may therefore enter the gate insulation layer. These charge carriers may be trapped by impurity atoms and imperfections in the gate insulation layer, finally resulting in an accumulation of charge carriers in the gate insulation layer that significantly affects the electrical characteristics of a device such as the threshold voltage of the transistor. (This effect is also referred to as hot carrier effect.) This problem becomes even worse with ever-decreasing gate insulation layer thickness, since a certain amount of the charge carriers entering the gate insulation will pass the gate insulation layer and contribute to an undesired parasitic gate leakage current.

As one possibility for a solution to this problem, typically the implantation step necessary for forming doped regions for the drain and source of the transistor is divided into two or more implantation steps. In a first implantation step, dopant atoms are implanted into the transistor active region with a low dose, and in a subsequent rapid thermal annealing step, these dopant atoms are activated, i.e., diffused, to occupy lattice sites in the semiconductor lattice. Subsequently, so-called sidewall spacers are formed at sidewalls of the gate electrode so as to form a mask for a second implantation step with a high concentration of dopant atoms to obtain the required conductivity of the drain and source, respectively. In a second rapid thermal annealing step, the dopant atoms with the high concentration are also activated. As a result, drain and source regions are formed in which a smoother transition in the concentration of the dopant atoms of the drain and source regions to the inversely lightly-doped channel region is obtained. Particularly, the areas of the drain and source regions adjacent to the gate insulation layer exhibit a significantly lower dopant concentration, so that the resulting lateral electric field is reduced and the probability for charge carriers to overcome the potential barrier is decreased. For feature sizes of cutting-edge semiconductor devices, i.e., for a channel length of 0.2 $\mu$m and less and for gate insulation layer thickness of 2 nm or less, a more gradual transition of the concentration is required to limit the peak intensity of the lateral electric field to an appropriate magnitude. Therefore, typically a modified implantation technique with additional implantation steps is employed to achieve a sufficient reduction of charge carrier accumulation in the gate insulation layer and a required reduction of parasitic gate leakage currents. In these additional implantation steps, a so-called halo region is formed in which the concentration of the dopant atoms decreases more gradually compared to a simple "two-step" implantation. To obtain the halo region surrounding the lightly doped regions, typically at least one implantation step is performed with a tilt angle so as to deposit dopant atoms having a varying concentration in an area adjacent to the lightly doped region and extending beyond the gate electrode. Drain and source regions formed in the above-explained manner exhibit a gradually decreasing dopant atom concentration from the highly doped source and drain region to the lightly doped region, and to the halo regions that more or less extend beyond the gate electrode. The halo regions contact the inversely doped channel region and provide, during operation of the device, a lateral electric field with a reduced maximum intensity at the drain-gate corner of the transistor, thereby significantly reducing the probability for charge carrier injection into the gate insulation layer. In order to obtain predictable device characteristics, however, it is important to precisely control the dimensions and shape of the halo region. Accordingly, the conventional method of forming lightly doped drain and source regions not only contributes to a more complex overall process flow due to the additional implantation steps necessary for generating the halo region, but also to the complexity of the individual implantation step, since it is difficult to precisely control concentration and penetration depth of the dopant atoms which is necessary to reproducibly and reliably form the lightly doped regions. Thus, according to the typical conventional process flow requiring the complex implantation technology, the throughput, and hence the productivity, is reduced.

In view of the above, a need exists for an improved method for forming lightly doped regions in a semiconductor device, wherein the shape of a lightly doped region is precisely controllable without adversely affecting productivity of the manufacturing process.

SUMMARY OF THE INVENTION

In view of the above problems, a method of forming a lightly doped region in a semiconductor device is provided. In one illustrative embodiment, the method comprises providing a substrate comprising a semiconductor region in an upper portion thereof, forming a dielectric layer over the substrate, the dielectric layer comprising dopant atoms of the first type having a first concentration and a first diffusion length with respect to the material of the semiconductor region, and further comprising dopant atoms of a second type having a second concentration and a second diffusion length with respect to the material of the semiconductor region, and applying a predefined temperature for a predefined time period to the substrate to allow dopant atoms of the first and second type to enter the semiconductor region to create a lightly doped region in the semiconductor region with a shape and a local dopant concentration that depend on the predefined temperature, the predefined time period, the first and second concentrations, and the first and second diffusion lengths.

According to this embodiment of the present invention, two types of dopant atoms are provided in a dielectric layer which diffuse in a subsequent thermal treatment into the underlying semiconductor region. By adjusting the concentration of the two types of dopant atoms and by selecting an appropriate temperature and an appropriate time period, a required dopant distribution may be obtained due to the predefined diffusion length of these dopants.

According to a further embodiment, by patterning the dielectric layer comprising the dopant atoms, diffusion of the dopant atoms may substantially be limited to the semiconductor region underlying the dielectric layer. Thus, the present invention allows the formation of a lightly doped region having a required extension and dopant distribution with a single manufacturing step.

In a further variation, the method comprises forming a gate electrode over the semiconductor region with a gate insulation layer electrically insulating the gate electrode from the semiconductor region. By forming the gate electrode prior to the formation of the dielectric layer, the method is advantageously adaptable to the production of field effect transistors having a required doping profile without the necessity of a complex and complicated implantation step.

In a further embodiment, the gate insulation layer comprises an oxide, and the step of applying a predefined temperature for a predefined time period is performed in an oxidizing ambient to increase a thickness of the gate insulation layer at edge portions thereof. Thus, the formation of an increased corner thickness of the gate insulation layer, which is a standard procedure in a conventional process flow, can be combined with the formation of the lightly doped region so that a reduction of the overall number of process steps necessary for producing a field effect transistor is accomplished.

In a further embodiment, the dielectric layer is deposited by chemical vapor deposition, wherein the dopant atoms are added to the reaction gases so that a required concentration of the dopant atoms is obtained in the final dielectric layer by means of a well-controllable process technique. Furthermore, the dielectric layer may be patterned to form sidewall spacers for a gate electrode, eliminating the necessity for an additional process step for forming the dielectric layer including the dopant atoms.

According to another embodiment of the present invention, a method of forming a lightly doped region in a semiconductor device comprises providing a substrate comprising a semiconductor region in an upper portion thereof forming a first dielectric layer comprising dopant atoms of a first type having a first concentration and a first diffusion length with respect to the material of the semiconductor region, performing a first diffusion step by applying a predefined temperature for a predefined time period to the substrate, thereby initiating diffusion of the dopant atoms of the first type into the semiconductor region, forming a second dielectric layer comprising dopant atoms of a second type having a second concentration and a second diffusion length with respect to the material of the semiconductor region, and performing a second diffusion step applying a predefined temperature for a predefined time period to the substrate to create a lightly doped region in the semiconductor region with a shape and a local dopant concentration that depend on the first and second diffusion steps, the first and second concentrations and the first and second diffusion lengths.

Accordingly, the diffusion may be split into two separate steps which may be advantageous for adapting the present invention to a given process flow, or, for example, in case of considerably different parameters of the dopant atoms of the first and second types, such as the diffusion length, when a diffusion in a single step would not result in the desired doping profile of the lightly doped regions.

In a further variation this method comprises the formation of a gate electrode over the semiconductor region with a gate insulation layer separating the gate electrode from the semiconductor region, prior to the formation of the first dielectric layer.

In a further embodiment, the first dielectric layer is deposited in an oxidizing ambient so that the thickness of the gate insulation layer near the sidewall edges of the gate electrode is increased in the same process step. The second dielectric layer may be deposited and patterned to form sidewall spacers for the gate electrode so that the process of forming the first and second dielectric layers with the first and second types of dopant atoms is fully compatible with a standard process flow.

BRIEF DESCRIPTION OF THE DRAWINGS

The invention may be understood by reference to the following description taken in conjunction with the accompanying drawings, in which like reference numerals identify like elements, and in which.

Figure 1A:
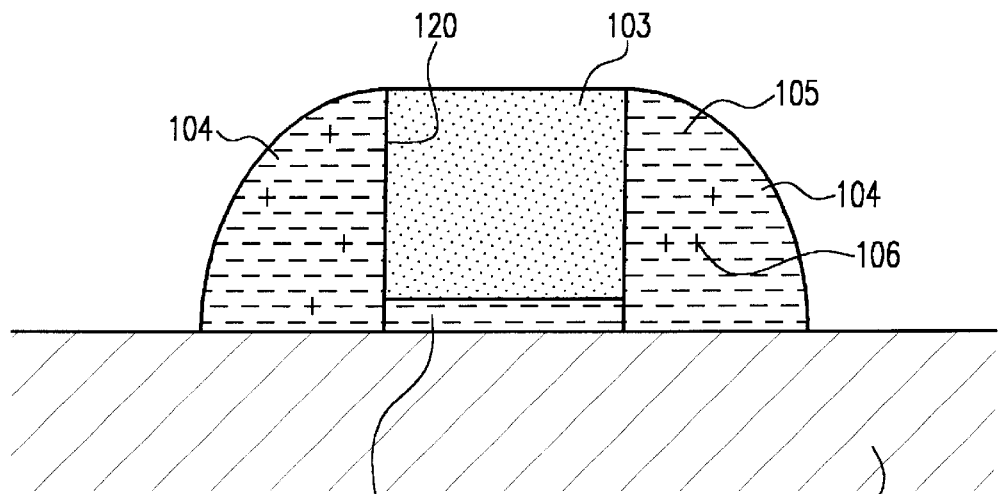
FIGS. 1a–1c schematically show cross-sectional views of a field effect transistor comprising a lightly doped region during various manufacturing stages in accordance with one embodiment of the present invention.

While the invention is susceptible to various modifications and alternative forms, specific embodiments thereof have been shown by way of example in the drawings and are herein described in detail. It should be understood, however, that the description herein of specific embodiments is not intended to limit the invention to the particular forms disclosed, but on the contrary, the intention is to cover all modifications, equivalents, and alternatives falling within the spirit and scope of the invention as defined by the appended claims.

DETAILED DESCRIPTION OF THE INVENTION

Illustrative embodiments of the invention are described below. In the interest of clarity, not all features of an actual implementation are described in this specification. It will of course be appreciated that in the development of any such actual embodiment, numerous implementation-specific decisions must be made to achieve the developers' specific goals, such as compliance with system-related and business-related constraints, which will vary from one implementation to another. Moreover, it will be appreciated that such a development effort might be complex and time-consuming, but would nevertheless be a routine undertaking for those of ordinary skill in the art having the benefit of this disclosure.

FIG. 1a schematically shows a cross-sectional view of a field effect transistor device in an initial manufacturing stage in accordance with one embodiment of the present invention. Over a substrate 101, which may be a silicon substrate, a germanium substrate, or any other semiconductor substrate like a II-IV semiconductor or a III-V semiconductor, or an insulating substrate with a semiconductor layer formed thereon, a gate electrode 103 is located and electrically isolated from the substrate 101 by a gate insulation layer 102. The gate electrode 103 may have a gate length, i.e., a horizontal extension of the gate electrode in FIG. 1a, of about 0.2 µm or less, since application of the present invention to sophisticated semiconductor devices is particularly advantageous. This transistor dimension is, however, merely an example, and the present invention may be employed with devices having other dimensions. The gate electrode 103 may be formed of any appropriate gate electrode material, such as polycrystalline silicon (polysilicon) or any other conductive material, such as an appropriate metal and the like. Gate insulation layer 102 preferably comprises, at least partially, silicon dioxide. At the sidewalls of the gate electrode 103, sidewall spacers 104 are formed which include dopant atoms of a first type 105 and dopant atoms of a second type 106. In the illustrated example, the dopant atoms of the first type have a valency of 5, indicated by minus signs, thus creating an n-doping, and the dopant atoms of the second type 106 have a valency of 3, indicated by plus signs, thus creating a p-doping. Since the present example is illustrated for an n-channel field effect transistor, a concentration of the dopant atoms of the first type 105 is significantly larger than the concentration of the dopant atoms of the second type 106 so that finally an n-doped region is obtained.

A typical process flow for forming the structure depicted in FIG. 1a may comprise the following steps. First, the gate insulation layer 102 is formed and subsequently the gate electrode material is deposited to form the gate electrode 103 by photolithography and etching, as is well known to the skilled person. Next, a material layer is deposited over the structure by chemical vapor deposition (CVD), forming a dielectric material layer comprising, for example, silicon dioxide. During the deposition step, additional reaction gases comprising the dopant atoms of the first and second type are fed into a corresponding CVD chamber. The required ratio of the concentration of the dopant atoms of the first and second type can be precisely adjusted by controlling the flow rate of the corresponding gases fed into the reaction chamber. In the present example, boron and phosphorus-containing gases are mixed with a TEOS-containing gas so as to deposit a silicon dioxide layer containing boron and phosphorus atoms having a predefined concentration and having a well-known diffusion length for a given temperature in the silicon of the underlying substrate 101. Thereafter, the dielectric layer is patterned by anisotropic etching to form the sidewall spacers 104.

Figure 1B:
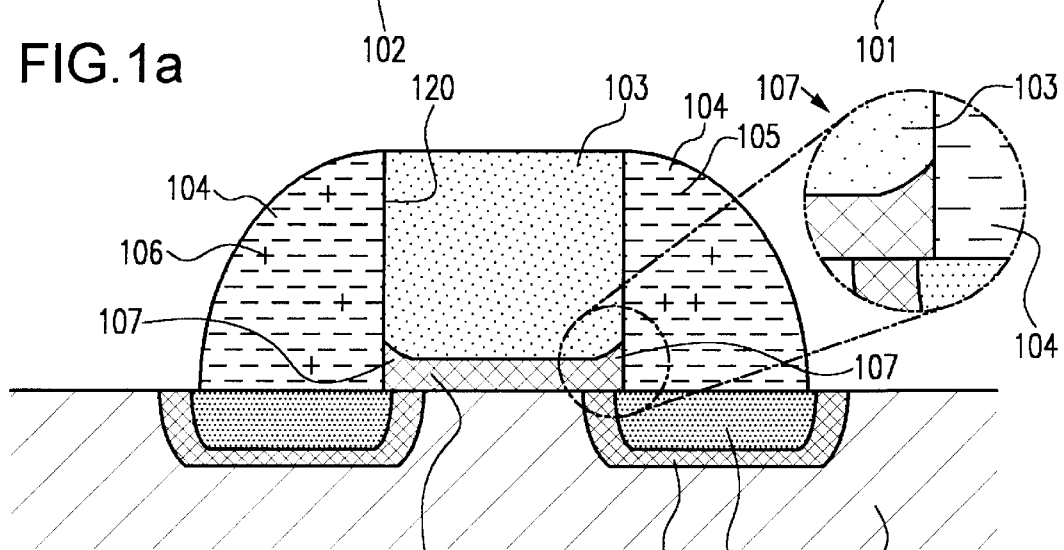

FIG. 1b schematically shows a cross-sectional view of the device depicted in FIG. 1a at an advanced manufacturing stage. FIG. 1b shows an area 107 of increased thickness of the gate insulation layer 102 adjacent to the respective sidewall spacers 104. For the sake of clarity, one of the areas 107 is depicted in detail in FIG. 1b. Located in the substrate 101 under respective sidewall spacers 104 and partially under the gate insulation layer 102, a lightly n-doped region 108 is formed which is enclosed by a so-called halo region 109 also exhibiting an n-doping, but with reduced concentration compared to the lightly n-doped region 108.

For forming the area 107 of increased thickness and the lightly doped region 108 and the halo region 109, the structure depicted in FIG. 1a is exposed to an oxidizing ambient for a predefined time period with a predefined temperature and a predefined oxygen concentration. The oxidizing ambient initiates a further "growth" of the silicon dioxide spacers 104 on and into the gate electrode material which in the present example, is polysilicon. This additional production of silicon dioxide leads to the slightly increased thickness of the gate insulation layer 102 at the interface to the sidewall spacers 104, thereby forming the areas 107. At the same time, the dopant atoms of the first type 105 and the dopant atoms of the second type 106 are partially diffused into the substrate 101, thereby forming the lightly doped region 108 and the halo region 109. Since the dopant atoms 105 and 106 have a well-known diffusion length and a well-controllable concentration, the extension of the diffused lightly doped region 108 and the diffused halo region 109 is precisely controllable by adjusting the temperature and the time interval for the diffusion step. In the present example, the diffusion length of the dopant atoms 105 is less than the diffusion length of the dopant atoms 106 so that in accordance with the applied temperature and the duration of the oxidizing step, the average penetration depth of the dopant atoms 106 is larger than the average penetration depth of the dopant atoms 105. Since the concentration of the dopant atoms 105 is considerably higher than the concentration of the dopant atoms 106, the region 108 contains a large number of dopant atoms 105 due to the smaller diffusion length and rapidly decreases with increasing penetration depth. On the other hand, the concentration of the dopant atoms 106 is small, whereas their diffusion length is larger than that of the dopant atoms 105, so that compared to the lightly doped region 108, a higher concentration of dopant atoms 106 is present in this area. Accordingly, the net amount of n-doping in the halo region 109 is significantly smaller than in the lightly doped region 108. This provides a relatively smooth transition of the doping concentration to a region underlying the gate insulation layer 102 and forming the channel region for the field effect transistor to be formed. Furthermore, the lateral extension of the regions 108 and 109 is affected by the lateral extension of the sidewall spacers 104 as these spacers serve as a dopant source. Thus, the lateral extension of the regions 108 and 109 may be varied by properly adjusting the lateral dimension of the sidewall spacers 104.

Figure 1C:
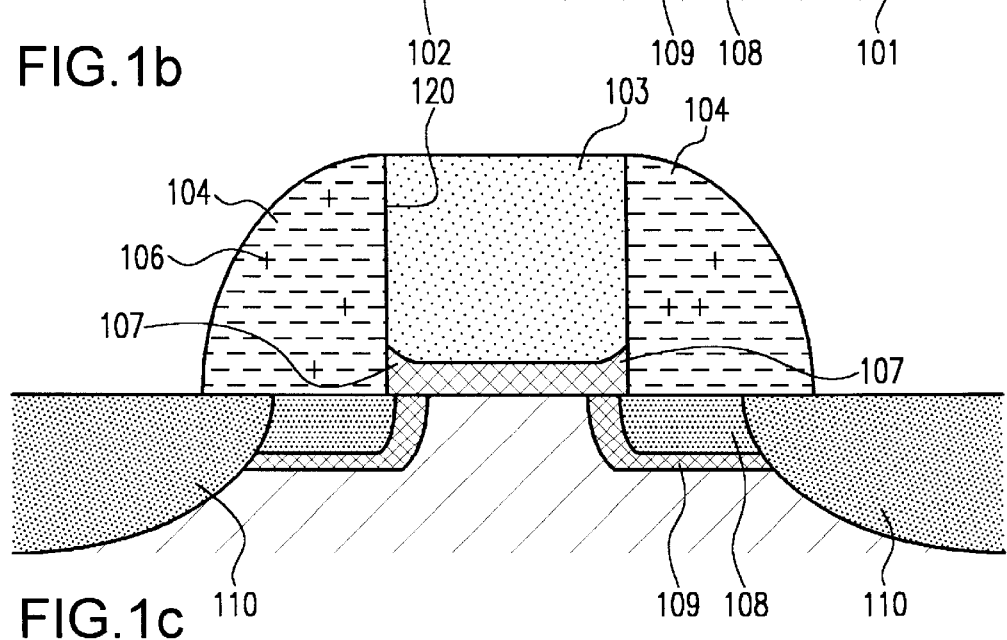

FIG. 1c schematically shows a cross-sectional view of the final transistor device comprising drain and source regions 110 that may be formed in accordance with a typical prior art process flow, i.e., by ion implantation and a subsequent rapid thermal annealing step.

As can be seen from the above embodiment, a dielectric layer is deposited comprising dopant atoms of two types which are then out-diffused in a single diffusion step so as to form a lightly doped region and a halo region surrounding the lightly doped region. Using two different types of dopant atoms provides for the possibility to create a required final doping profile by selecting dopant candidates having appropriate parameters such as diffusion length and valency. It should be noted that more than two types of dopant atoms may be used to establish a desired doping profile. Preferably, the diffusion step is carried out in an oxidizing ambient so as to avoid a further process step for forming edge portions of the gate insulation layer with an increased thickness. As previously mentioned, the shape and degree of doping of the lightly doped region and the halo region may be controlled by well-known deposition parameters and the type of atoms selected as the dopant atoms of the first and second type.

Figure 2A:
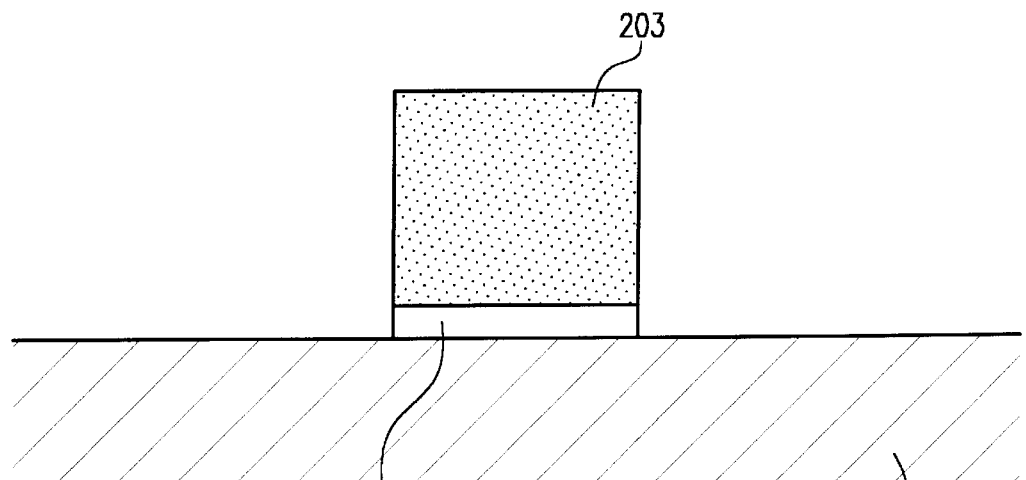
FIGS. 2a–2c schematically show cross-sectional views of a field effect transistor having lightly doped regions during various manufacturing stages in accordance with a further embodiment of the present invention.
Figure 2B:
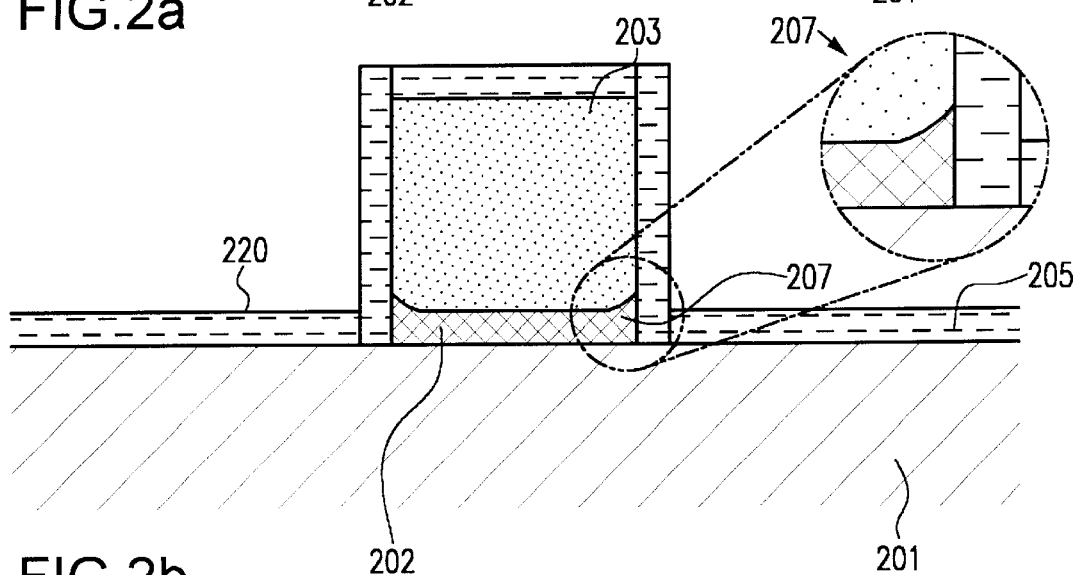
Figure 2C:
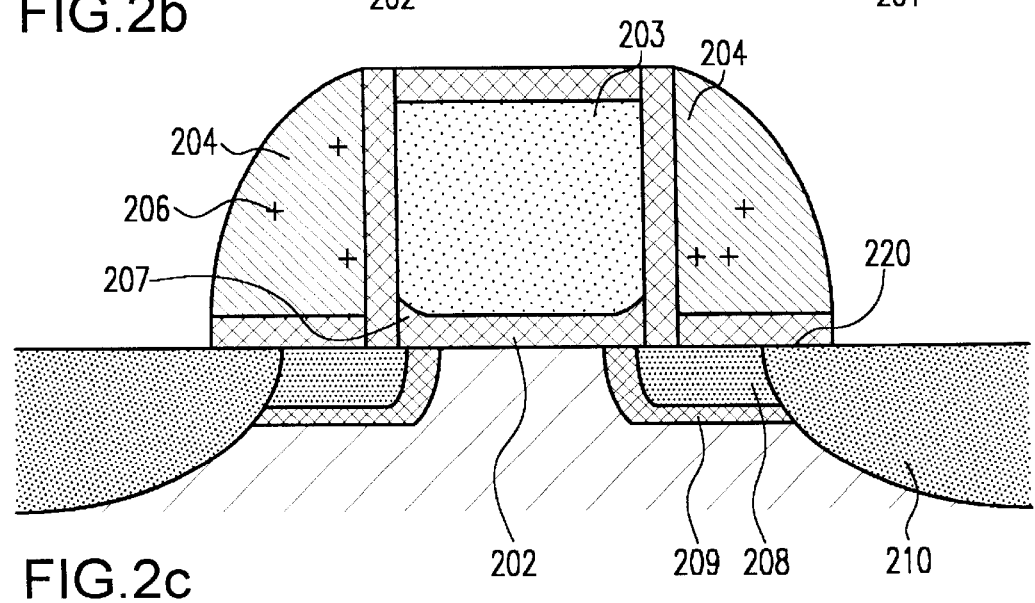

With reference to FIGS. 2a–2c, a further embodiment of the present invention will now be described. FIG. 2a schematically shows a cross-sectional view of a field effect transistor in an initial manufacturing stage. In FIG. 2a, a gate electrode 203 is located above a substrate 201 and is electrically insulated therefrom by a gate insulation layer 202. Regarding the substrate 201 and the materials for the gate electrode 203 and the gate insulation layer 202, the same criteria as given above with reference to FIGS. 1a–1c also apply in this case.

FIG. 2b schematically shows the device of FIG. 2a with a first dielectric layer 220, including dopant atoms of a first type 205. Furthermore areas 207 of increased thickness at the edges of the gate insulation layer 202 are formed. In the present embodiment, the first dielectric layer 220 is substantially an oxide layer which is formed by exposing the structure of FIG. 2a to an oxidizing ambient that additionally includes dopant atoms of the first type 205 with a specified concentration. The dopant atoms of the first type are represented by a minus sign. During the oxidation, silicon of the substrate 201 and of the gate electrode material, such as polysilicon, is consumed and a silicon dioxide layer is formed on the substrate and on the gate electrode 203. The oxidation process results in the formation of the areas 207 of increased thickness. In this example, the dopant atoms 205 are of a type that will lead to an n-conductivity region when diffused into the substrate 201. It should be noted, however, that p-type dopant atoms may also be used as dopant atoms in the first dielectric layer 220. Moreover, the dopant atoms may be added to the oxidizing ambient at an initial stage of the oxidizing step, resulting in a gradual diffusion of the dopant atoms into the substrate during the entire oxidation step, or the dopant atoms may be added to the oxidizing ambient at a final stage of the oxidizing step so as to create a dopant atom concentration essentially limited to the first dielectric layer 220.

FIG. 2c schematically shows a cross-section of the final device. In FIG. 2c, side-wall spacers 204 comprising dopant atoms of a second type 206, indicated by plus signs, with a specified concentration are formed at the sidewalls of the gate electrode 203. Below the sidewall spacers 204 and partially below the gate insulation 202, a lightly n-doped region 208, surrounded by halo region 209, is formed. Adjacent to the lightly doped region 208 and the halo region 209, heavily doped drain and source regions 210 are formed.

The structure depicted in FIG. 2c may be formed in accordance with the following process flow. After forming the first dielectric layer 220, a second dielectric layer is deposited over the structure containing the dopant atoms 206 of the second type with a specified concentration. As previously explained with reference to FIGS. 1a–1c, the concentration of the dopant atoms 206 is controlled by feeding a gaseous component to the reaction chamber for depositing the second dielectric layer. The second dielectric layer may comprise, for example, silicon nitride or silicon dioxide. Subsequently, the sidewall spacers 204 are patterned from the second dielectric layer by anisotropic etching as in a conventional process flow. Thereafter, the structure is subjected to a heat treatment applying a specified temperature for a specified time period so as to allow the dopant of the first type 205 and the dopant of the second type to diffuse into the substrate 201. As previously mentioned, the dopant atoms of the first type 205 may be added during an initial phase of the oxidation step such that most of the dopant atoms have been diffused into the underlying region during the oxidation step, which, then, may be considered as a first diffusion step. In accordance with the respective diffusion length and concentrations as well as the applied temperature and the time period of the diffusion step, the lightly n-doped region 208 and the halo region 209 are formed in the same manner as was explained with reference to FIGS. 1a–1c. Finally, the drain and the source regions 210 are produced by conventional ion implantation and a subsequent rapid thermal annealing. Thus, the semiconductor of FIG. 2b comprises a gradual transition of concentration so that a lateral electric field applied to the drain and source during operation of the device has its peak intensity at an area that is laterally located farther away from the gate insulation layer such that the injection of charge carriers into the gate insulation layer and the gate electrode is significantly reduced. It is to be noted that more than one type of dopant atoms in the dielectric layer 220 and/or in the sidewall spacers 204 may be used to create a desired doping profile in the regions 208 and 209.

As a result, the present invention allows the formation of the lightly doped region and the halo region by a diffusion step rather than by ion implantation. Thus, precise control of the shape and extension of the lightly doped regions is obtained, thereby avoiding the necessity of complex implantation steps. When the diffusion step is performed in an oxidizing ambient, increasing the gate insulation layer at the edges adjacent to the sidewalls of the gate electrode may be carried out in the same process step, thereby reducing the number of processes, which in turn will lead to a higher efficiency in productivity. Although the present invention has been described with reference to an n-channel field effect transistor, it should be noted that formation of a lightly doped region with an outer sphere of a further decreased doping concentration (halo region) by means of forming adjacent dielectric layers including the required dopant atoms and subsequently diffusing the dopant atoms into the adjacent region can be employed on any other semiconductor structure. Furthermore, although reference was made to dopant atoms of a first and second type, any number of types of dopant atoms can be used so as to obtain a required net concentration in a specified region. For example, in the embodiment described with reference to FIGS. 2a–2c, a first dielectric layer 220 may comprise p-type dopant atoms and the sidewall spacers may comprise n-type dopant atoms. Furthermore, the dopant atoms of the first and second type need not necessarily exhibit a different valency, but may both represent p-type or n-type atoms that may exhibit a different diffusion length.

The particular embodiments disclosed above are illustrative only, as the invention may be modified and practiced in different but equivalent manners apparent to those skilled in the art having the benefit of the teachings herein. For example, the process steps set forth above may be performed in a different order. Furthermore, no limitations are intended to the details of construction or design herein shown, other than as described in the claims below. It is therefore evident that the particular embodiments disclosed above may be altered or modified and all such variations are considered within the scope and spirit of the invention. Accordingly, the protection sought herein is as set forth in the claims below.

What is claimed:

1. A method of forming a lightly doped region in a semiconductor device comprising:

providing a substrate comprising a semiconductor region in an upper portion thereof;

forming a first dielectric layer of the substrate, the first dielectric layer comprising dopant atoms of a first type having a first concentration and a first diffusion length with respect to the material of the semiconductor region;

forming a second dielectric layer over the first dielectric layer, the second dielectric layer comprising dopant atoms of a second type and a second concentration and a second diffusion length with respect to the material of the semiconductor region, and applying a predefined temperature for a predefined time period to the substrate to allow dopant atoms of the first and second type to enter the semiconductor region to create a lightly doped region in the semiconductor region with a shape and a local dopant concentration that depend on the predefined temperature, the predefined time period, the first and second concentrations, and first and second diffusion length.

2. The method of claim 1, further comprising performing a heat treatment prior to the formation of the second dielectric layer to allow dopant atoms of the first type to enter the semiconductor region.

3. The method of claim 1, further comprising forming a gate electrode over the semiconductor region with a gate insulation layer electrically insulating the gate electrode from the semiconductor region.

4. The method of claim 3, wherein the first dielectric layer is formed by oxidizing the substrate and the gate electrode material, wherein dopant atoms of the first type are added to the oxidizing ambient.

5. The method of claim 4, wherein the gate insulation layer comprises an oxide, and a thickness of the gate insulation layer at the corner portions thereof is increased during the formation of the first dielectric layer.

6. The method of claim 2, wherein forming the second dielectric layer comprises patterning of the second dielectric layer to form sidewall spacers adjacent to sidewalls of the gate electrode.

7. The method of claim 1, wherein the second dielectric layer is formed by chemical vapor deposition and the concentration of the dopant atoms of the second type is adjusted by feeding a gaseous component with a specified flow rate during deposition of the second dielectric layer.

8. The method of claim 1, wherein the first dielectric layer comprises two or more dopant atoms of different types, each type of dopant atom having a different one of valency and diffusion length.

9. The method of claim 1, wherein the second dielectric layer comprises two or more dopant atoms of different types, each type of dopant atom having a different one of valency and diffusion length.

10. The method of claim 1, wherein the first dielectric layer comprises one of n-type and p-type dopant atoms.

11. The method of claim 1, wherein the second dielectric layer comprises one of n-type and p-type dopant atoms.

* * * * *